United States Patent
Ko et al.

(10) Patent No.: US 12,430,824 B2
(45) Date of Patent: *Sep. 30, 2025

(54) MAGNETIC RESONANCE IMAGE PROCESSING APPARATUS AND METHOD

(71) Applicant: AIRS MEDICAL INC., Seoul (KR)

(72) Inventors: Jin Kyu Ko, Seoul (KR); Jae Yeon Yoon, Gyeonggi-do (KR); Keun Woo Jeong, Seoul (KR)

(73) Assignee: AIRS MEDICAL INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/740,937

(22) Filed: Jun. 12, 2024

(65) Prior Publication Data

US 2024/0331226 A1 Oct. 3, 2024

Related U.S. Application Data

(63) Continuation of application No. 17/424,368, filed as application No. PCT/KR2020/006853 on May 27, 2020, now Pat. No. 12,045,915.

(30) Foreign Application Priority Data

Feb. 13, 2020 (KR) .......................... 10-2020-0017998

(51) Int. Cl.
G06T 11/00 (2006.01)
G01R 33/48 (2006.01)
G06T 7/00 (2017.01)

(52) U.S. Cl.
CPC ........ G06T 11/006 (2013.01); G01R 33/4818 (2013.01); G06T 7/0012 (2013.01);
(Continued)

(58) Field of Classification Search
CPC ................. G06T 11/006; G06T 7/0012; G06T 2207/10088; G06T 2207/20056;
(Continued)

(56) References Cited

U.S. PATENT DOCUMENTS 9,196,062 B2 11/2015 Hwang et al.
10,198,799 B2 2/2019 Park et al.
(Continued)

FOREIGN PATENT DOCUMENTS

CN 102798829 A 11/2012
CN 106597333 A 4/2017
(Continued)

OTHER PUBLICATIONS

International Search Report from corresponding PCT Application No. PCT/KR2020/006853, dated Nov. 9, 2020.
(Continued)

*Primary Examiner* — Jose L Couso
(74) *Attorney, Agent, or Firm* — Harness, Dickey & Pierce, P.L.C.

(57) ABSTRACT

The present invention is to provide a magnetic resonance image processing method. According to an embodiment of the present invention, a magnetic resonance image processing method by a magnetic resonance image processing apparatus comprises the steps of: obtaining a sub-sampled magnetic resonance signal; acquiring first k-space data from the sub-sampled magnetic resonance signal using a first parallel imaging technique; obtaining a first magnetic resonance image from the first k-space data by using an inverse Fourier operation; generating first input image data by preprocessing the first magnetic resonance image; and obtaining a first output magnetic resonance image from the first input image data using a first artificial neural network mode.

12 Claims, 16 Drawing Sheets

(52) U.S. Cl.
CPC ............... *G06T 2207/10088* (2013.01); *G06T 2207/20056* (2013.01); *G06T 2207/20084* (2013.01); *G06T 2207/20224* (2013.01); *G06T 2207/30096* (2013.01)

(58) Field of Classification Search
CPC ........... G06T 2207/20084; G06T 2207/20224; G06T 2207/30096; G06T 5/00; G06T 7/00; G06T 2211/40; G06T 2207/30016; G06T 2210/41; G06T 11/003; G06T 11/005; G06T 2211/421; G06T 2211/424; G06T 3/4046; G06T 9/002; G06T 2207/20076; G06T 2207/20081; G01R 33/4818; G01R 33/5608; G01R 33/5611; G01R 33/56; G01R 33/561; G01R 33/48; G01R 33/565; G01R 33/546; A61B 5/055; A61B 5/0033; A61B 5/7257; A61B 5/00; A61B 5/7207; A61B 5/7264; G06F 17/14; G06F 19/142; G06F 19/00; G06F 17/142; G06V 10/454; G06V 10/764; G06V 2201/03; G06V 2201/031; G06V 10/54; G06V 10/774; G06V 10/82; G06V 30/18057; G06N 3/02; G06N 3/08–088; G06N 3/0445; G06N 3/0454; G06N 3/4046; G06N 7/00; G06N 20/00; G06K 7/1482; Y10S 128/925

See application file for complete search history.

(56) References Cited

U.S. PATENT DOCUMENTS

| | | | |
|---|---|---|---|
| 2017/0061620 A1 | 3/2017 | Park et al. | |
| 2018/0024215 A1* | 1/2018 | Zhu | G01R 33/543 324/309 |
| 2019/0244399 A1* | 8/2019 | Li | G01R 33/56509 |
| 2019/0257905 A1* | 8/2019 | Cheng | G01R 33/5608 |
| 2019/0266761 A1* | 8/2019 | Malkiel | G01R 33/4822 |
| 2019/0347772 A1* | 11/2019 | Zhang | G06T 5/60 |
| 2019/0369190 A1 | 12/2019 | Ye et al. | |
| 2020/0003858 A1* | 1/2020 | Takeshima | G01R 33/5608 |
| 2020/0011951 A1 | 1/2020 | Shi et al. | |
| 2020/0034998 A1 | 1/2020 | Schlemper et al. | |
| 2020/0041592 A1* | 2/2020 | Huang | G01R 33/5619 |
| 2020/0072933 A1 | 3/2020 | Ye et al. | |
| 2020/0090382 A1* | 3/2020 | Huang | G06N 3/084 |
| 2020/0103483 A1 | 4/2020 | Hardy et al. | |
| 2020/0202586 A1* | 6/2020 | Li | G06N 3/045 |
| 2020/0202587 A1* | 6/2020 | Palma | G06T 7/33 |
| 2020/0217914 A1* | 7/2020 | Huang | G01R 33/561 |
| 2020/0300954 A1* | 9/2020 | Sharma | G01R 33/4835 |
| 2021/0035337 A1 | 2/2021 | Kim et al. | |
| 2021/0166445 A1 | 6/2021 | Wang et al. | |
| 2021/0192808 A1* | 6/2021 | Chen | G06N 3/044 |
| 2021/0224634 A1* | 7/2021 | Chen | G01R 33/56545 |
| 2021/0264645 A1 | 8/2021 | Polak et al. | |
| 2021/0333344 A1* | 10/2021 | Liang | G01R 33/5608 |
| 2022/0075017 A1 | 3/2022 | Sabuncu et al. | |

FOREIGN PATENT DOCUMENTS

| | | |
|---|---|---|
| JP | 2015-533531 A | 11/2015 |
| JP | 2019-111322 A | 7/2019 |
| KR | 10-1330638 B1 | 11/2013 |
| KR | 10-1659578 B1 | 9/2016 |
| KR | 10-2018-0049166 A | 5/2018 |
| KR | 10-1923184 B1 | 11/2018 |
| KR | 10-2019-0124994 A | 11/2019 |
| KR | 10-2019-0138107 A | 12/2019 |
| WO | WO-2019/039708 A1 | 2/2019 |

OTHER PUBLICATIONS

Sriram, A., et al.; Grappanet: Combining Parallel Imaging With Deep Learning for Multi-Coil MRI Reconstruction, Electrical Engineering and Systems Science, Dec. 18, 2019, pp. 1-18.

Office Action from corresponding U.S. Appl. No. 17/424,368, dated Jan. 11, 2024.

Notice of Allowance from corresponding U.S. Appl. No. 17/424,368, dated Apr. 12, 2024.

* cited by examiner

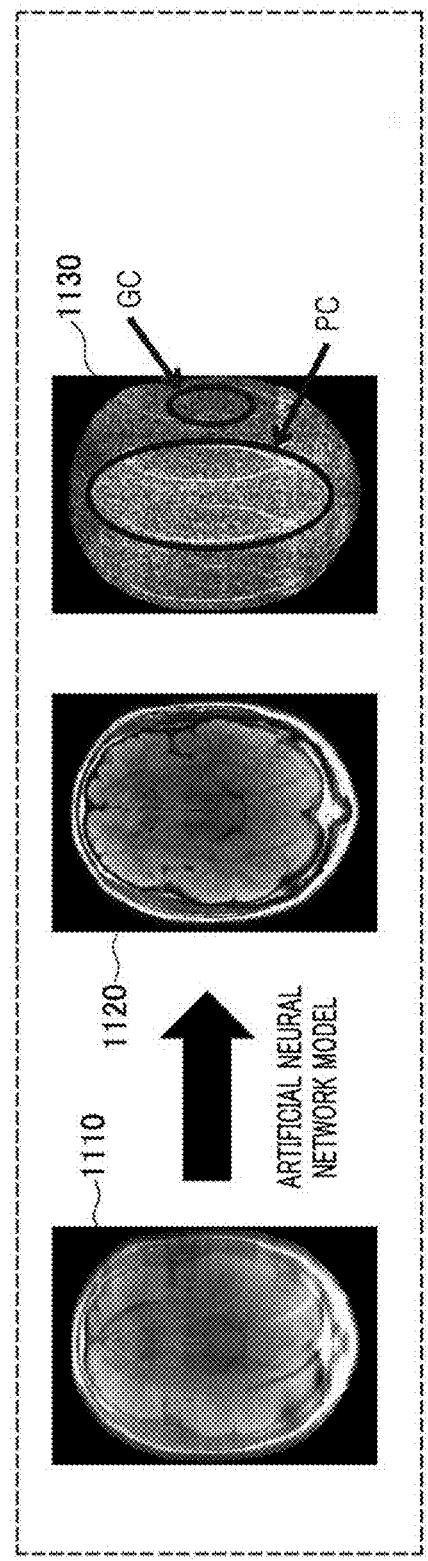

MAGNETIC RESONANCE IMAGE PROCESSING APPARATUS AND METHOD

CROSS-REFERENCE TO RELATED APPLICATIONS

This application is a continuation application of U.S. application Ser. No. 17/424,368, filed on 20 Jul. 2021, which is a national phase application of PCT Application No. PCT/KR2020/006853, filed on 27 May 2020, which claims the benefit of and priority to Korean Patent Application No. 10-2020-0017998, filed on 13 Feb. 2020. The entire disclosures of the applications identified in this paragraph are incorporated herein by references.

TECHNICAL FIELD

The present invention relates to a magnetic resonance image processing apparatus and a magnetic resonance image processing method, and more particularly, to a magnetic resonance image processing apparatus for accelerating acquisition of a magnetic resonance image from a magnetic resonance signal using an artificial neural network, and a magnetic resonance image processing method.

BACKGROUND

In general, medical imaging apparatuses are apparatuses that acquire body information of a patient to provide an image. Medical imaging apparatuses include X-ray imaging apparatuses, ultrasound diagnosis apparatuses, computed tomography apparatuses, and magnetic resonance imaging (MRI) apparatuses.

Here, MRI enables a nuclear magnetic resonance phenomenon to occur in a hydrogen atomic nucleus in the human body by using a magnetic field and non-ionizing radiation which are harmless to the human body, thereby imaging density and physical/chemical properties of the atomic nucleus. The MRI apparatus holds an important position in a diagnosis field using medical images because image capturing conditions are not limited relatively, a variety of information about soft tissue is provided, and an image having excellent contrast is provided.

Specifically, an MRI apparatus is an image diagnostic apparatus that supplies energy having a constant frequency to an atomic nucleus in a state in which a constant magnetic field is applied to the atomic nucleus and converts energy emitted from the atomic nucleus into a signal to diagnose the interior of the human body. Since a proton constituting an atomic nucleus intrinsically has spin angular momentum and a magnetic dipole, when a magnetic field is applied on protons, the protons are arranged in a direction of the magnetic field, and the atomic nucleus performs a precession about the direction of the magnetic field. Images of the human body may be acquired through a nuclear magnetic resonance phenomenon, and the nuclear magnetic resonance phenomenon may be caused by such precession.

Meanwhile, imaging by an MRI apparatus may take 20 minutes to one hour or more according to an area to be imaged and a type of a magnetic resonance (MR) image. That is, there is a disadvantage in that an imaging time of the MRI apparatus is relatively long as compared with other medical imaging apparatuses. Such a disadvantage may put a burden on a patient, and in particular, the disadvantage makes it difficult to perform imaging on a patient with claustrophobia. Therefore, techniques for reducing an imaging time have been developed recently, and improvement is also required in terms of image quality.

SUMMARY

Technical Problem

The present invention is directed to facilitating a diagnosis of a lesion area of a patient by providing a magnetic resonance image processing apparatus and a magnetic resonance image processing method capable of acquiring a high-quality reconstructed image with shortening a magnetic resonance imaging time.

Technical Solution

According to one embodiment of the present invention, a magnetic resonance image processing method performed by a magnetic resonance image processing apparatus includes acquiring a sub-sampled magnetic resonance signal, acquiring first k-space data from the sub-sampled magnetic resonance signal using a first parallel imaging technique, acquiring a first magnetic resonance image from the first k-space data using an inverse fast Fourier transform operation, preprocessing the first magnetic resonance image to generate first input image data, and acquiring a first output magnetic resonance image from the first input image data using a first artificial neural network model.

When the sub-sampled magnetic resonance signal is provided as a plurality of sub-sampled magnetic resonance signals, the first k-space data may be acquired as a plurality of pieces of first k-space data, and the first magnetic resonance image may be acquired as a plurality of first magnetic resonance images, and the preprocessing of the first magnetic resonance image to generate the first input image data may include combining the plurality of first magnetic resonance images to acquire a single second magnetic resonance image and preprocessing the second magnetic resonance image to generate the first input image data.

The combining of the plurality of first magnetic resonance images to acquire the single second magnetic resonance image may be performed using [Equations 1] below.

$$c_i = S_i \cdot m \qquad \text{[Equation 1]}$$

$$m_{real} = \left(\sum_i |c_i|^2\right)^{\frac{1}{2}}$$

$$\left(\sum_i |S_i|^2\right)^{\frac{1}{2}} = 1$$

$C_i$=an $i^{th}$-first magnetic resonance image.
$S_i$=a sensitivity matrix of an $i^{th}$ coil.
m=the second magnetic resonance image according to complex value information.
$m_{real}$=the second magnetic resonance image according to real value information.

The combining of the plurality of first magnetic resonance images to acquire the single second magnetic resonance image may be performed using [Equation 2] below.

$$m = \sum_i S_i^* \cdot c_i \qquad \text{[Equation 2]}$$

m=the second magnetic resonance image according to complex value information.

$S_i^*$=a conjugate transposed matrix of a sensitivity matrix of an $i^{th}$ coil.

$C_i$=an $i^{th}$-first magnetic resonance image.

The first magnetic resonance image may include a target image and an image aliased in a phase encoding direction, and the preprocessing of the first magnetic resonance image to generate the first input image data may include shifting the first magnetic resonance image such that the aliased image matches the target image to acquire the shifted first image, and stacking and grouping the first magnetic resonance image and the shifted first magnetic resonance image in a first direction perpendicular to each of the phase encoding direction and a readout direction to generate the first input image data.

The second magnetic resonance image may include a target image and an image aliased in a phase encoding direction, and the preprocessing of the second magnetic resonance image to generate the first input image data may include shifting the second magnetic resonance image such that the aliased image matches the target image to acquire the shifted second magnetic resonance image, and stacking and grouping the second magnetic resonance image and the shifted second magnetic resonance image in a first direction perpendicular to each of the phase encoding direction and a readout direction to generate the first input image data.

A noise pattern image generated based on the first magnetic resonance image may be input to the first artificial neural network model.

The first artificial neural network model may have an artificial neural network structure including a contracting path and an expanding path, the contracting path may include a plurality of convolution layers and pooling layers, the expanding path may include a plurality of convolution layers and unpooling layers, and the noise pattern image may be input to at least one of the plurality of convolution layers and the unpooling layers of the expanding path.

The magnetic resonance image processing method may include acquiring second k-space data from the first output magnetic resonance image using a fast Fourier transform operation, wherein the acquiring of the second k-space data includes decombining the first output magnetic resonance image to acquire a plurality of second output magnetic resonance images and acquiring the second k-space data from the second output magnetic resonance images using the fast Fourier transform operation.

The decombining of the first output magnetic resonance image to acquire the plurality of second output magnetic resonance images may be performed using [Equation 3] or [Equation 4] below.

$$\ddot{c}_i = S_i \cdot \dot{m} \quad \text{[Equation 3]}$$

$\ddot{C}_i$=an $i^{th}$-second output magnetic resonance image.
$S_i$=a sensitivity matrix of an $i^{th}$ coil.
$\dot{m}$=the first output magnetic resonance image according to complex value information.

$$\ddot{c}_i = S_i \cdot (\dot{m}_{real} \cdot \exp(i \cdot \varphi)) \quad \text{[Equation 4]}$$

$\ddot{C}_i$=the $i^{th}$-second output magnetic resonance image.
$S_i$=the sensitivity matrix of the $i^{th}$ coil.

$\dot{m}_{real}$=the first output magnetic resonance image according to real value information.
$\exp(i \cdot \varphi)$=phase information of the first output magnetic resonance image.

The magnetic resonance image processing method may include acquiring third k-space data from the second k-space data using a second parallel imaging technique.

The magnetic resonance image processing method may include acquiring a third magnetic resonance image from the third k-space data using the inverse fast Fourier transform operation, preprocessing the third magnetic resonance image to generate second input image data, and acquiring a third output magnetic resonance image from the second input image data using a second artificial neural network model.

According to one embodiment of the present invention, a magnetic resonance image processing apparatus for performing a magnetic resonance image processing method includes a memory in which a magnetic resonance image processing program is stored, and a processor configured to execute the program, wherein the processor executes the program to acquire a sub-sampled magnetic resonance signal, acquire first k-space data from the sub-sampled magnetic resonance signal using a first parallel imaging technique, acquire a first magnetic resonance image from the first k-space data using an inverse fast Fourier transform operation, preprocess the first magnetic resonance image to generate first input image data, and acquire a first output magnetic resonance image from the first input image data using a first artificial neural network model.

Advantageous Effects

According to a magnetic resonance image processing apparatus and a magnetic resonance image processing method according to the present invention, a diagnosis of a lesion area of a patient can be facilitated by providing the magnetic resonance image processing apparatus and the magnetic resonance image processing method capable of providing a high-quality reconstructed image even when a magnetic resonance imaging time is shortened.

In addition, a magnetic resonance image processing apparatus and a magnetic resonance image processing method according to the embodiments of the present invention acquire a plurality of magnetic resonance images and provide an output magnetic resonance image with high accuracy which is reconstructed from input data generated by preprocessing the plurality of magnetic resonance images by using a first artificial neural network model and a second artificial neural network model, thereby facilitating a diagnosis of a lesion area of a patient.

BRIEF DESCRIPTION OF THE DRAWINGS

FIGS. 11A and 11B shows diagrams for describing a noise pattern image applied to an artificial neural network model as learning data according to one embodiment of the present invention.

DETAILED DESCRIPTION

Figure 1:
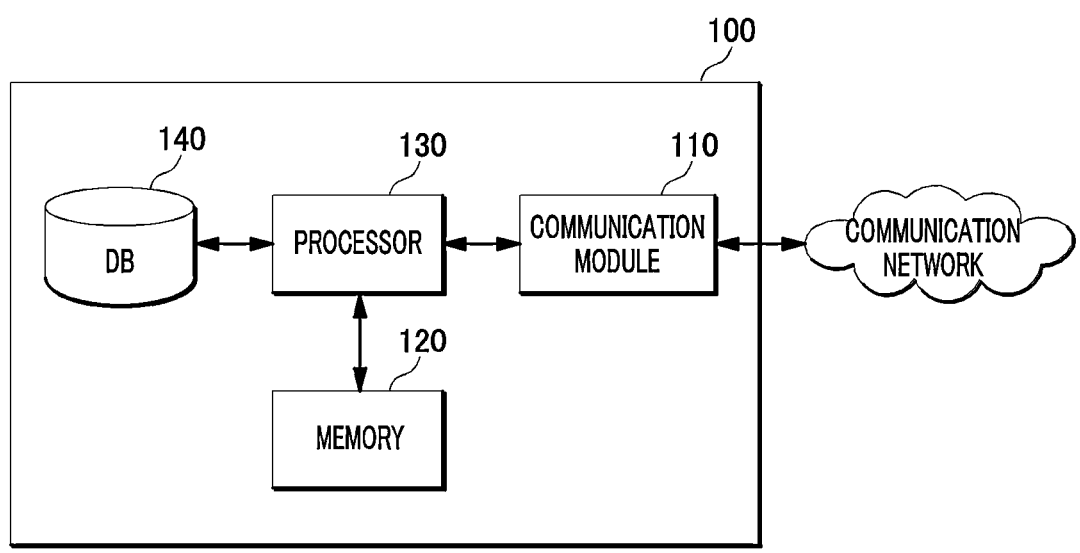
FIG. 1 is a block diagram illustrating a configuration of a magnetic resonance image processing apparatus according to one embodiment of the present invention.

Hereinafter, embodiments of the present invention will be described in detail with reference to the accompanying drawings so that those of ordinary skill in the art to which the present invention pertains can easily carry out the embodiments. However, the present invention may be embodied in different forms and is not limited to the embodiments set forth herein. In order to clarify the present invention, parts which are not related with the description will be omitted from the drawings, and like reference numbers will be used to refer to like parts throughout the drawings.

The present specification does not describe all elements of embodiments, and common knowledge in the technical field to which the present invention pertains or the same descriptions of the embodiments will be omitted. The term "part" or "portion" used in the specification may be implemented using hardware or software, and according to embodiments, one "part" or "portion" may be implemented as a single unit or element or include a plurality of units or elements.

In the present specification, an "image" may refer to multi-dimensional data composed of discrete image elements (for example, pixels in a two-dimensional (2D) image and voxels in a three-dimensional (3D) image). For example, the image may include a medical image of an object captured by a magnetic resonance imaging (MRI) apparatus, a computed tomography (CT) apparatus, an ultrasound imaging apparatus, or an X-ray imaging apparatus.

In the present specification, an "object" may be a target to be imaged and include a human, an animal, or a part of a human or animal. For example, the object may include a body part (an organ) or a phantom. The phantom refers to a material having a volume that is very close to a density and effective atomic number of an organism. The phantom may include a spherical phantom having similar properties to the human body.

An MRI system is a system which acquires a sectional image of a part of an object by expressing a strength of a magnetic resonance (MR) signal with respect to a radio frequency (RF) signal generated in a magnetic field having a specific strength through a contrast.

Specifically, in the MRI system, a main magnet generates a static magnetic field to align a magnetic dipole moment direction of a specific atomic nucleus of an object positioned in the static magnetic field in a direction of the static magnetic field direction. A gradient coil may apply a gradient signal to a static magnetic field to generate a gradient magnetic field, thereby inducing resonance frequencies differently according to parts of an object. An RF coil may emit an RF signal so as to match a resonance frequency of a part of an object whose image is to be acquired. In addition, when a gradient magnetic field is generated, the RF coil may receive MR signals having different resonance frequencies emitted from a plurality of parts of the object. The MRI system acquires an image by applying an image reconstruction technique to the MR signals received through such operations. In addition, the MRI system may perform serial or parallel signal processing on a plurality of MR signals received by a multi-channel RF coil to reconstruct the plurality of MR signals into image data.

Hereinafter, an MR image processing apparatus 100 according to one embodiment of the present invention will be described.

The MR image processing apparatus 100 according to one embodiment of the present invention relates to an MR image processing apparatus 100 which is applied directly or indirectly to the above-described MRI system to accelerate acquisition of an MR image from an MR signal.

The MR image processing apparatus 100 may include not only an MRI system capable of acquiring an MR image by detecting an MR signal by itself, but also an image processing apparatus for processing an externally acquired image, and a smartphone, a tablet personnel computer (PC), a PC, a smart television (TV), a micro-server, other home appliances, and other mobile or non-mobile computing devices which have a function of processing an MR image. In addition, the MR image processing apparatus 100 may include wearable devices, which have a communication function and a data processing function, such as a watch, glasses, a hair band, and a ring.

FIG. 1 is a block diagram illustrating a configuration of the MR image processing apparatus 100 according to one embodiment of the present invention.

Referring to FIG. 1, the MR image processing apparatus 100 may include a communication module 110, a memory 120, a processor 130, and a database (DB) 140.

The communication module 110 may provide a communication interface in the MR image processing apparatus 100 by interworking with a communication network and may serve to transmit and receive data to and from an MRI apparatus, a user terminal, and a management server. Here, the communication module may be a device including hardware and software necessary for transmitting and receiving signals such as control signals or data signals through a wired/wireless connection with other network devices.

The memory 120 may be a storage medium on which an MR image processing program is recorded. In addition, the memory 120 may perform a function of temporarily or permanently storing data processed by the processor. Here, the memory 120 may include a volatile storage medium or a non-volatile storage medium, but the scope of the present invention is not limited thereto.

The processor 130 may control an overall process performed by the MR image processing program in the MR image processing apparatus 100. Each operation of the process performed by the processor 130 will be described below with reference to FIGS. 2 to 15.

Here, the processor 130 may include any type of device capable of processing data, such as a processor. Here, the "processor" may refer to, for example, a data processing device that is embedded in hardware and includes a circuit physically structured to perform a function expressed in a code or command included in a program. Examples of the data processing device embedded in hardware may include a microprocessor, a central processing unit (CPU), a processor core, a multiprocessor, an application-specific integrated circuit (ASIC), a field programmable gate array (FPGA), and the like, but the scope of the present invention is not limited thereto.

The DB 140 may store a variety of data that is necessary for the MR image processing apparatus 100 to execute a program. For example, the DB may store learning data of an artificial neural network, data about an MR signal 310, k-space data, MR image data, and the like which will be described below.

Meanwhile, in the present invention, a "terminal" may include a wireless communication device with ensured portability and mobility, for example, any type of handheld-based wireless communication device such as a smartphone, a tablet PC, or a notebook computer. In addition, the "terminal" may include wearable devices, which have a communication function and a data processing function, such as a watch, glasses, a hair band, and a ring. Furthermore, the "terminal" may include a wired communication device such as a PC that may be connected to another terminal or server through a network.

In addition, the network refers to a connection structure that enables information exchange between nodes such as devices and servers and includes a local area network (LAN), a wide area network (WAN), Internet (WWW: World Wide Web), a wired or wireless data communication network, a telecommunication network, a wired or wireless television network, and the like. Examples of the wireless data communication network may include 3G, 4G, 5G, $3^{rd}$ generation partnership project (3GPP), Long Term Evolution (LTE), World Interoperability for Microwave Access (WiMAX), Wi-Fi, Bluetooth communication, infrared communication, ultrasonic communication, visible light communication (VLC), LiFi, and the like, but the scope of the present invention is not limited thereto.

Figure 2:
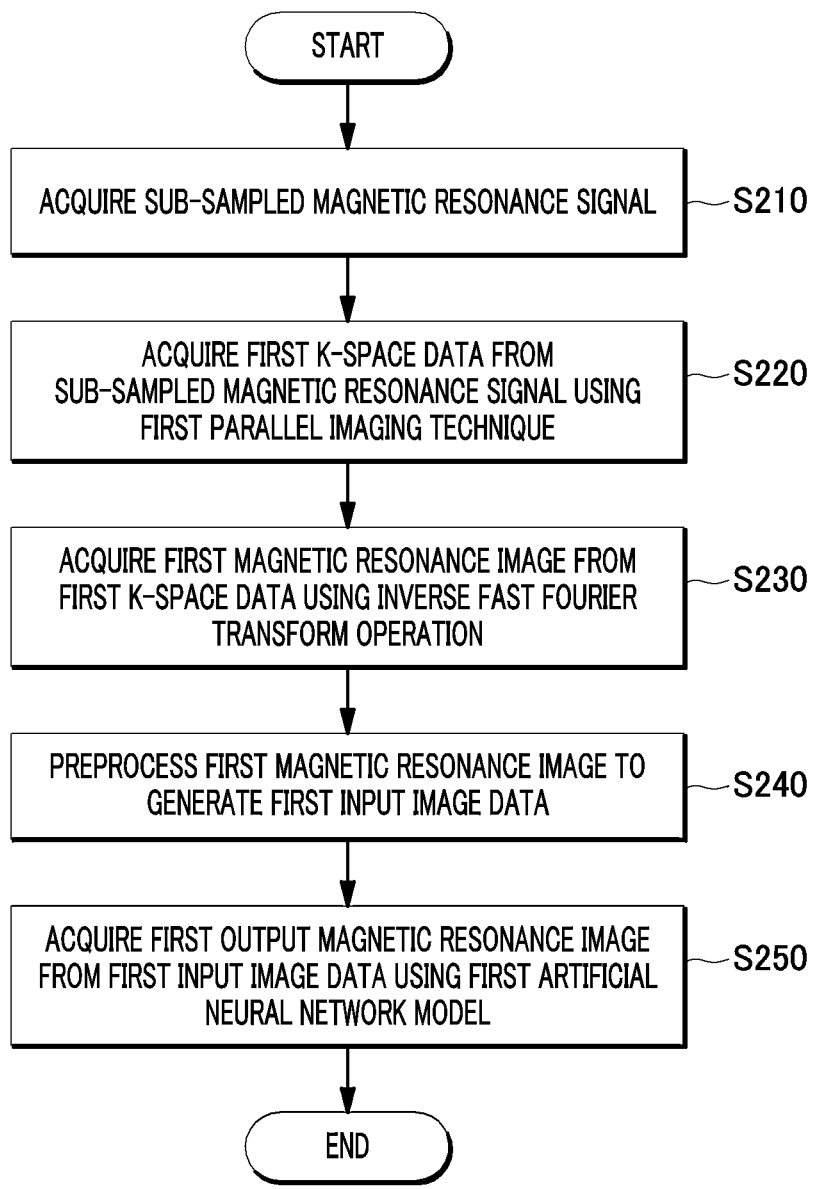
FIG. 2 is a flowchart illustrating a sequence of a magnetic resonance image processing method according to one embodiment of the present invention.
Figure 3:
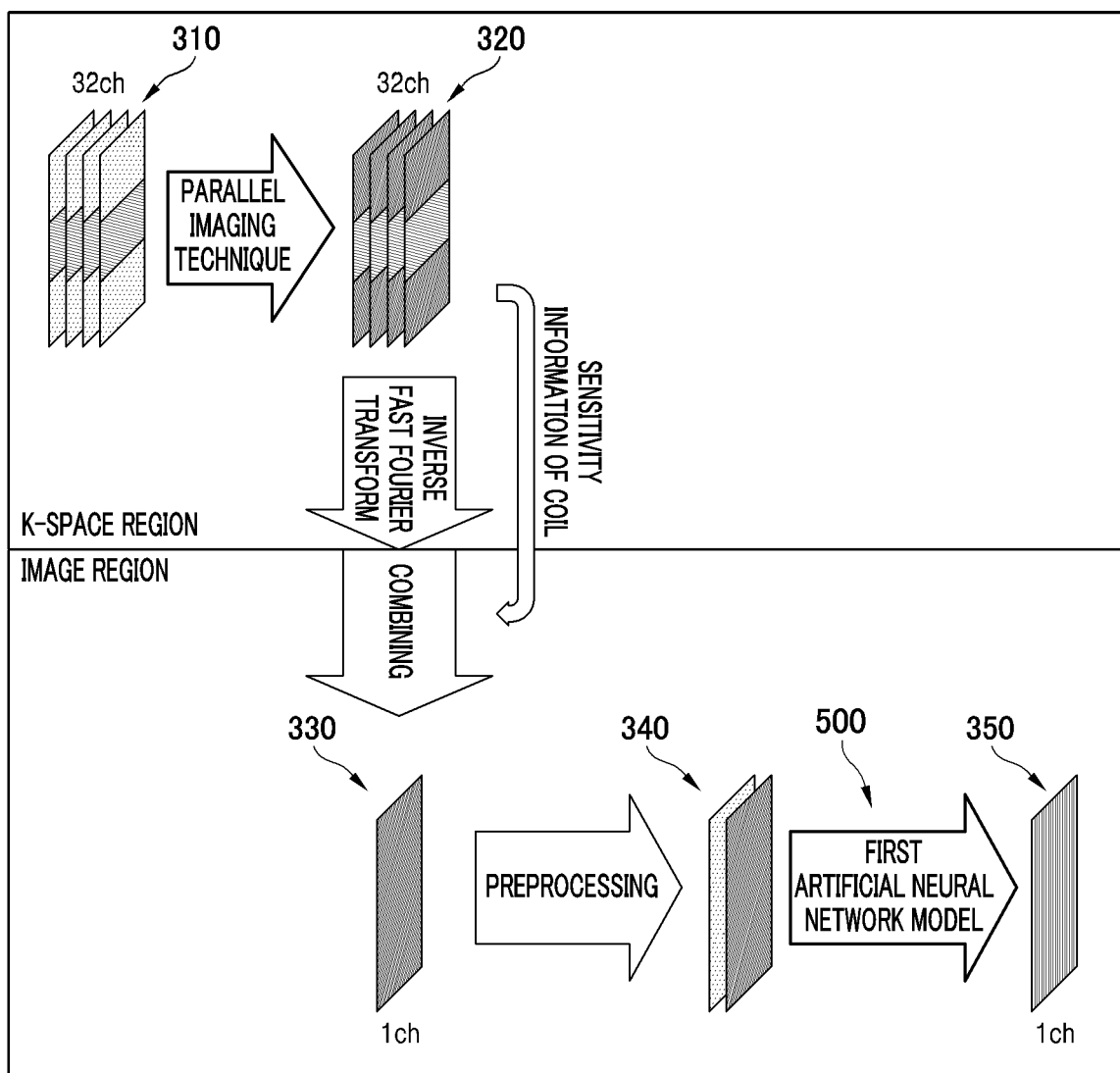
FIG. 3 is a schematic diagram illustrating the magnetic resonance image processing method according to one embodiment of the present invention.

Hereinafter, an MR image processing method performed by the MR image processing apparatus 100 according to one embodiment of the present invention will be described in detail. FIG. 2 is a flowchart illustrating a sequence of an MR image processing method according to one embodiment of the present invention. FIG. 3 is a schematic diagram illustrating the MR image processing method according to one embodiment of the present invention.

Referring to FIGS. 2 and 3, in the MR image processing method performed by an MR image processing apparatus 100 according to one embodiment of the present invention, first, operation S210 of acquiring a sub-sampled MR signal 310 may be performed.

Figure 4:
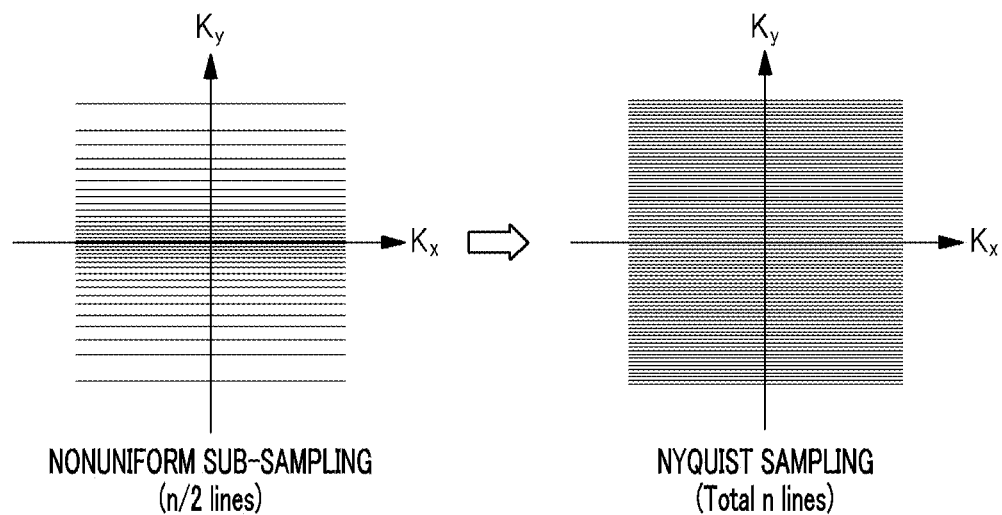
FIG. 4 shows schematic diagrams for describing a difference between full-sampling and sub-sampling according to one embodiment of the present invention.

FIG. 4 shows schematic diagrams for describing a difference between full-sampling and sub-sampling according to one embodiment of the present invention.

Referring to FIG. 4, the sub-sampled MR signal 310 may be an MR signal 310 sampled at a sampling rate less than a Nyquist sampling rate. In addition, a sub-sampled MR image is an image acquired by sampling the MR signal 310 at a sampling rate less than the Nyquist sampling rate. The sub-sampled MR image may be an image including an aliasing artifact. The aliasing artifact may be an artificial image generated in an MR image when a scanned object is greater than a field of view (FOV). Meanwhile, a full-sampled MR image may be an image acquired by sampling k-space data at a sampling rate greater than or equal to the Nyquist sampling rate.

For example, the number of lines of a full-sampled MR signal 310 may be n, and the number of lines of the sub-sampled MR signal 310 may be n/2. Here, when a degree by which the number of sampled lines is decreased is a multiple of ½, it may be considered that an acceleration index of MR imaging is 2. When degrees by which the number of sampled lines is decreased are a multiple of ⅓ and a multiple of ¼, it may be considered that acceleration indexes are 3 and 4.

A sub-sampling method may be divided into a uniform sub-sampling method and a nonuniform sub-sampling method. The uniform sub-sampling method may mean that sampling is performed by constantly maintaining an interval between sampled lines. On the other hand, the nonuniform sub-sampling method may generally mean that sampling is performed more by gradually decreasing an interval between sampled lines in a direction toward a center of sampling data and sampling is performed less by gradually increasing the interval between the sampled lines in a direction away from the center of the sampling data.

Meanwhile, the MR image processing apparatus 100 may be included in an MRI system and may acquire input data corresponding to the sub-sampled MR signal 310 based on an MR signal received from an RF coil. In addition, the MR image processing apparatus 100 may acquire input data corresponding to the sub-sampled MR signal 310 from at least one of an external MR imaging apparatus, an external server, and a DB.

Referring again to FIGS. 2 and 3, after operation S210, operation S220 of acquiring first k-space data 320 from the sub-sampled MR signal 310 using a first parallel imaging technique may be performed.

Here, a parallel imaging technique is a type of image reconstruction technique for acquiring k-space data and/or an MR image with high accuracy such as full-sampled k-space data and/or a full-sampled MR image from the sub-sampled MR signal 310 and/or sub-sampled k-space data.

In performing image reconstruction according to the parallel imaging technique, well-known techniques such as sensitivity profiles from an array of coils for encoding and reconstruction in parallel (SPACE RIP), simultaneous acquisition of spatial harmonics (SMASH), partially parallel imaging with localized sensitivity (PILS), generalized auto-calibrating partially parallel acquisitions (GRAPPA), and iterative self-consistent parallel imaging reconstruction (SPIRIT) may be applied without limitation as long as the well-known techniques may be applied to the parallel imaging technique.

Figure 5:
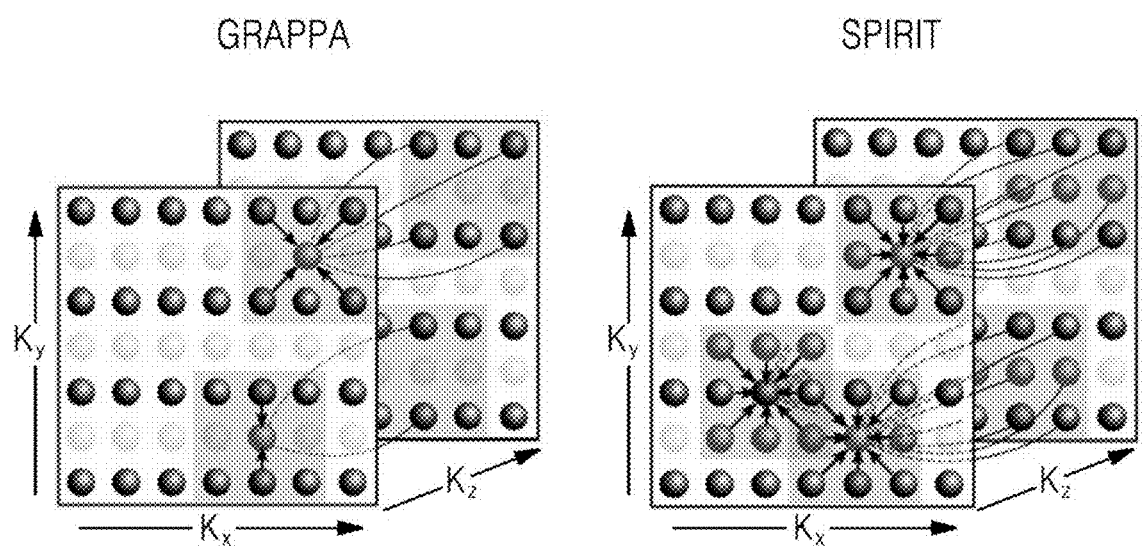
FIG. 5 shows schematic diagrams for describing a difference between generalized autocalibrating partially parallel acquisitions (GRAPPA) and iterative self-consistent parallel imaging reconstruction (SPIRIT) which are parallel imaging techniques according to one embodiment of the present invention.

FIG. 5 shows schematic diagrams for describing a difference between GRAPPA and SPIRIT which are parallel imaging techniques according to one embodiment of the present invention.

Referring to FIGS. 4 and 5, image reconstruction may be performed by applying the GRAPPA, in which full-sampled k-space image data is output using the sub-sampled MR signal 310 as input data, as the first parallel imaging technique.

That is, the first parallel imaging technique may be a GRAPPA technique. The GRAPPA may correct data about the sub-sampled MR signal 310 into high accuracy k-space data similar to full-sampled k-space data. In other words, when the number of lines of full-sampled image data is n and the number of lines of sub-sampled image data is n/2, the GRAPPA may estimate and generate the remaining unsampled n/2 lines from n/2 lines of the sub-sampled image data.

For example, in the sub-sampled MR signal 310 acquired from one channel of the RF coil, when a first line, a third line, and a fourth line are sampled and a second line is not sampled, the second line may be estimated by linearly combining the first line and the third line which are lines closest to the second line. As described above, the GRAPPA may estimate the remaining unsampled lines from a linear combination of adjacent lines, thereby correcting image data similarly to full-sampled image data. That is, it is possible to generate image data in a high accuracy k-space form for each channel.

Unlike such GRAPPA, the SPIRIT may estimate unsampled pixel data by linearly combining data of a pixel adjacent to a line including a pixel to be estimated and data of sampled lines adjacent to a corresponding line.

After operation S220, operation S230 of acquiring a first MR image from the first k-space data 320 using an inverse fast Fourier transform (IFFT) operation may be performed.

The GRAPPA may generate the first MR image, which is a reconstructed image, by performing an IFFT on image data in a complete k-space form. Here, the first MR image may include a target image and an image aliased in a phase encoding direction $K_y$.

Referring to FIGS. 4 and 5, the phase encoding direction $K_y$ may be a direction extending parallel to a direction in which lines sampled in a process of sampling the MR signal 310 are stacked. A readout direction $K_x$ may be a direction in which the sampled lines extend. Meanwhile, a direction $K_z$ may refer to an axial direction of a coil or a first direction $K_z$ that is orthogonal to each of the phase encoding direction $K_y$ and the readout direction $K_x$ which will be described below.

Meanwhile, when the sub-sampled MR signal 310 is provided as a plurality of sub-sampled MR signals 310, the first k-space data 320 may be acquired as a plurality of first k-space data 320 and the first MR image may be acquired as a plurality of first MR images. That is, when the RF coil for receiving the MR signal 310 is provided as a plurality of RF coils, a plurality of reconstructed images generated to correspond to the plurality of MR signals 310 received through respective channels become the first MR images.

After operation S230, operation S240 of preprocessing the first MR image to generate first input image data 340 may be performed.

Figure 6:
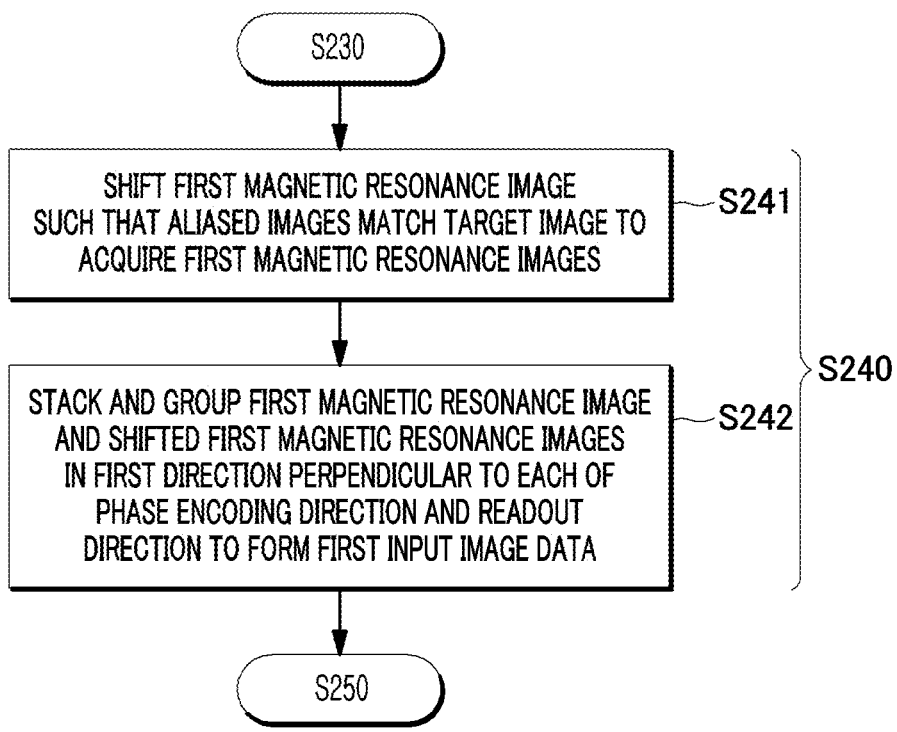
FIG. 6 is a flowchart illustrating a sequence of a method of preprocessing a first magnetic resonance image according to one embodiment of the present invention.

FIG. 6 is a flowchart illustrating a sequence of a method of preprocessing a first MR image according to one embodiment of the present invention. FIG. 7 shows schematic diagrams showing the method of preprocessing the first MR image according to one embodiment of the present invention.

Referring to FIGS. 6 and 7, operation S240 of preprocessing a first MR image 720 to generate first input image data 740 may include operation S241 of shifting the first MR image 720 such that aliased images A1 and A2 match a target image T to acquire first MR images 710 and 730.

Figure 7A:
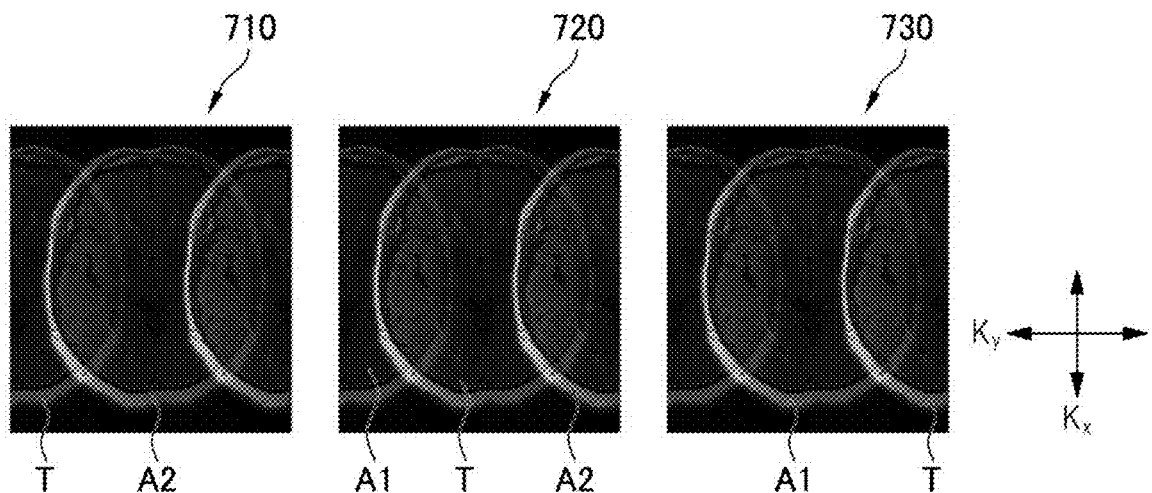
FIGS. 7A and 7B shows schematic diagrams showing the method of preprocessing the first magnetic resonance image according to one embodiment of the present invention.

Referring to FIG. 7A, for example, the first MR image 720 may include the target image T of an object (brain) and the aliased images A1 and A2. Here, when the first MR image 720 is shifted leftward/rightward in the phase encoding direction $K_y$, the shifted first MR images 710 and 730 may be acquired.

Here, shifting the first MR image 720 may be performed by shifting the aliased images A1 and A2 so as to match the target image T. For example, the aliased image A2 of the object included in the first MR image 710 shifted leftward may be shifted to be disposed at the same position as a position of the target image T of the object included in the original first MR image 720 based on a plane formed by the phase encoding direction $K_y$ and the readout direction $K_x$. In addition, the aliased image A1 of the object included in the first MR image 730 shifted rightward may be shifted to be disposed at the same position as the position of the target image T of the object included in the original first MR image 720 based on the plane formed by the phase encoding direction $K_y$ and the readout direction $K_x$.

Figure 7B:
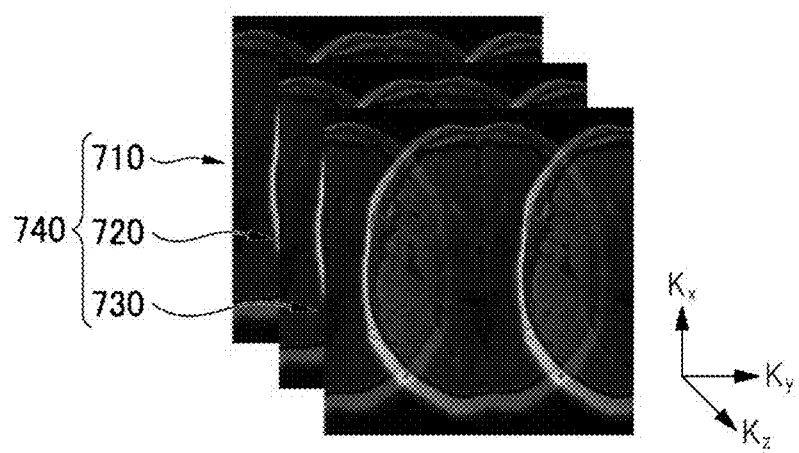

Referring to FIG. 7B, operation S240 of preprocessing the first MR image 720 to generate the first input image data 740 may include operation S242 of stacking and grouping the first MR image 720 and the shifted first MR images 710 and 730 in the first direction $K_z$ perpendicular to each of the phase encoding direction $K_y$ and the readout direction $K_x$ to form the first input image data 740.

Here, the first direction $K_z$ is a direction parallel to a direction $K_z$ of FIG. 7B. The phase encoding direction $K_y$ is a direction parallel to a direction $K_y$ of FIG. 7B, and the readout direction $K_x$ is a direction parallel to a direction $K_x$ of FIG. 7B. The stacked first MR images 720 and the plurality of shifted first MR images 710 and 730 are grouped into one group and generated into the first input image data 740 input to a first artificial neural network model 500 to be described below.

Figure 8:
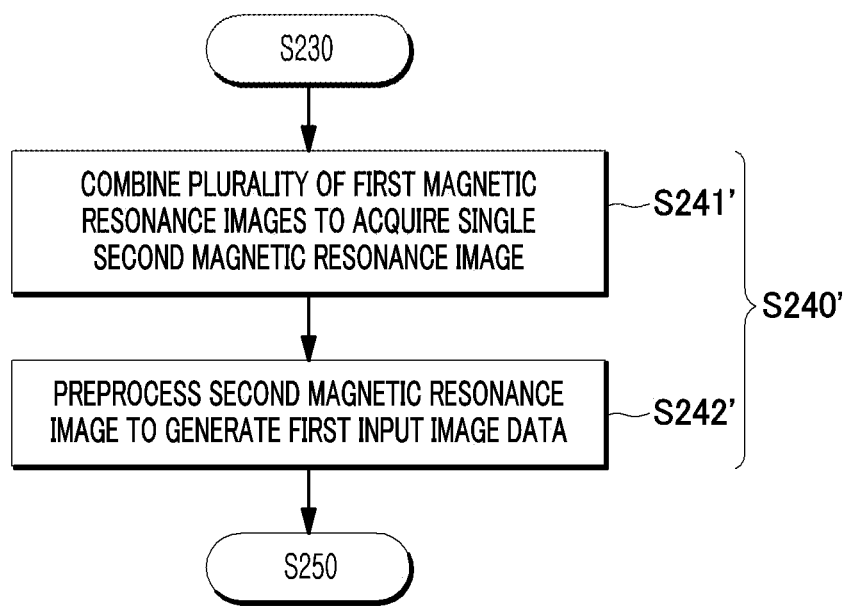
FIG. 8 is a flowchart illustrating a sequence of a method of preprocessing the first magnetic resonance image to generate first input image data according to a modified embodiment of the present invention.

FIG. 8 is a flowchart illustrating a sequence of a method of preprocessing the first MR image to generate the first input image data 340 according to a modified embodiment of the present invention.

Referring to FIG. 8, as the modified embodiment of the present invention, operation S240' of preprocessing the first MR image to generate the first input image data 340 may include operation S241' of combining a plurality of first MR images to acquire a single second MR image 330. The plurality of first MR images may be generated from the MR signals 310 received through a plurality of channels of the RF coil. The combining is a process of inputting the plurality of first MR images received through a multi-coil to output the single second MR image 330.

Specifically, operation S241' of combining the plurality of first MR images to acquire the single second MR image 330 may be performed using [Equations 1] below.

$$c_i = S_i \cdot m \quad \text{[Equation 1]}$$

$$m_{real} = \left(\sum_i |c_i|^2\right)^{\frac{1}{2}}$$

$$\left(\sum_i |S_i|^2\right)^{\frac{1}{2}} = 1$$

$C_i$=an $i^{th}$-first MR image.

$S_i$=a sensitivity matrix of an $i^{th}$ coil.

m=a second MR image according to complex value information.

$m_{real}$=a second MR image according to real value information.

Here, the second MR image 330 may be acquired based on first MR image information and sensitivity information of the RF coil. The first MR image information may be obtained by multiplying information about the second MR image 330 by sensitivity information of each coil as a weight. Meanwhile, as a method of acquiring the second MR image 330, there is a method of acquiring the second MR image 330 by dividing the first MR image by sensitivity information of each corresponding coil, which may cause a problem of noise amplification. Accordingly, in order to prevent noise amplification and to simplify and accelerate a calculation, it may be easy to acquire the second MR image 330 according to real value information. In order to be able to acquire the second MR image 330 according to the real value information, the sum of sizes of sensitivity matrices of respective coils should satisfy 1.

Meanwhile, operation S241' of combining the plurality of first MR images to acquire the single second MR image 330 may be performed using [Equation 2] below.

$$m = \sum_i S_i^* \cdot c_i \quad \text{[Equation 2]}$$

m=a second MR image according to complex value information.

$S_i^*$=a conjugate transposed matrix of a sensitivity matrix of an $i^{th}$ coil.

$C_i$ is an $i^{th}$-first MR image.

[Equation 2] may be used to acquire the second MR image 330 based on complex value information. In this case, a calculation may be more complicated as compared with a case in which [Equations 1] are applied to acquire the second MR image 330, but there is an advantage in that the more accurate second MR image 330 may be acquired.

Operation S240' of preprocessing the first MR image to generate the first input image data 340 may include operation S242' of preprocessing the combined second MR image 330 using [Equations 1] or [Equation 2] above to generate the first input image data 340.

The second MR image 330 in which the plurality of first MR images are combined may include a target image and an image aliased in the phase encoding direction $K_y$. In operation S242' of preprocessing the second MR image 330 to generate the first input image data 340, the same process may be performed as in the above-described operation S240 of preprocessing the first MR image to generate the first input image data 340.

That is, operation S242' of preprocessing the second MR image 330 to generate the first input image data 340 may include an operation (not shown) of shifting the second MR image 330 such that the aliased image matches the target image to acquire a shifted second MR image 330 and an operation (not shown) of stacking and grouping the second MR image 330 and the shifted second MR image 330 in the first direction $K_z$ perpendicular to the phase encoding direction $K_y$ and the readout direction $K_x$ to generate the first input image data 340.

In summary, through a process of combining the plurality of first MR images to acquire the second MR image 330 and generating the first input image data 340 therefrom, the first input image data 340 with high accuracy may be generated based on a larger amount of data about the MR signals 31 and input to an artificial neural network to be described below.

After operation S240, operation S250 of acquiring a first output MR image 350 from the first input image data 340 using the first artificial neural network model 500 may be performed.

Figure 9:
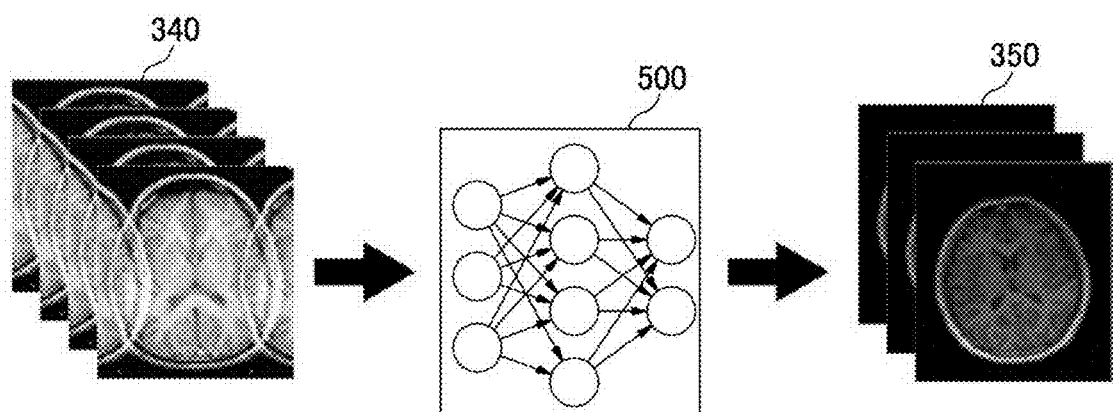
FIG. 9 shows a schematic diagram and images showing an operation of acquiring a first output magnetic resonance image from first input image data using a first artificial neural network model according to one embodiment of the present invention.

FIG. 9 shows schematic diagrams showing an operation of acquiring the first output MR image 350 from the first input image data 340 using the first artificial neural network model 500 according to one embodiment of the present invention.

Referring to FIG. 9, the first artificial neural network model 500 may be a set of algorithms for learning a correlation between at least one sub-sampled MR image and at least one full-sampled MR image using statistical machine learning results. The first artificial neural network model 500 may include at least one neural network. The neural network may include types of network models such as a deep neural network (DNN), a recurrent neural network (RNN), bidirectional recurrent deep neural network (BRDNN), a multilayer perceptron (MLP), and a convolutional neural network (CNN), but the scope of the present invention is not limited thereto.

For example, the first artificial neural network model 500 may be a model constructed by learning the correlation between at least one sub-sampled MR image and at least one full-sampled MR image in a unit of pixels of one or more sampled lines which are stacked in the phase encoding direction $K_y$ using the neural network.

In addition, the first artificial neural network model 500 may be constructed using a variety of additional data in addition to the sub-sampled MR image and the full-sampled MR image. For example, as the additional data, at least one of k-space data corresponding to the first MR image, real image data, imaginary image data, magnitude image data, phase image data, sensitivity data of a multi-channel RF coil, and data about a noise pattern image NP may be used.

Figure 10:
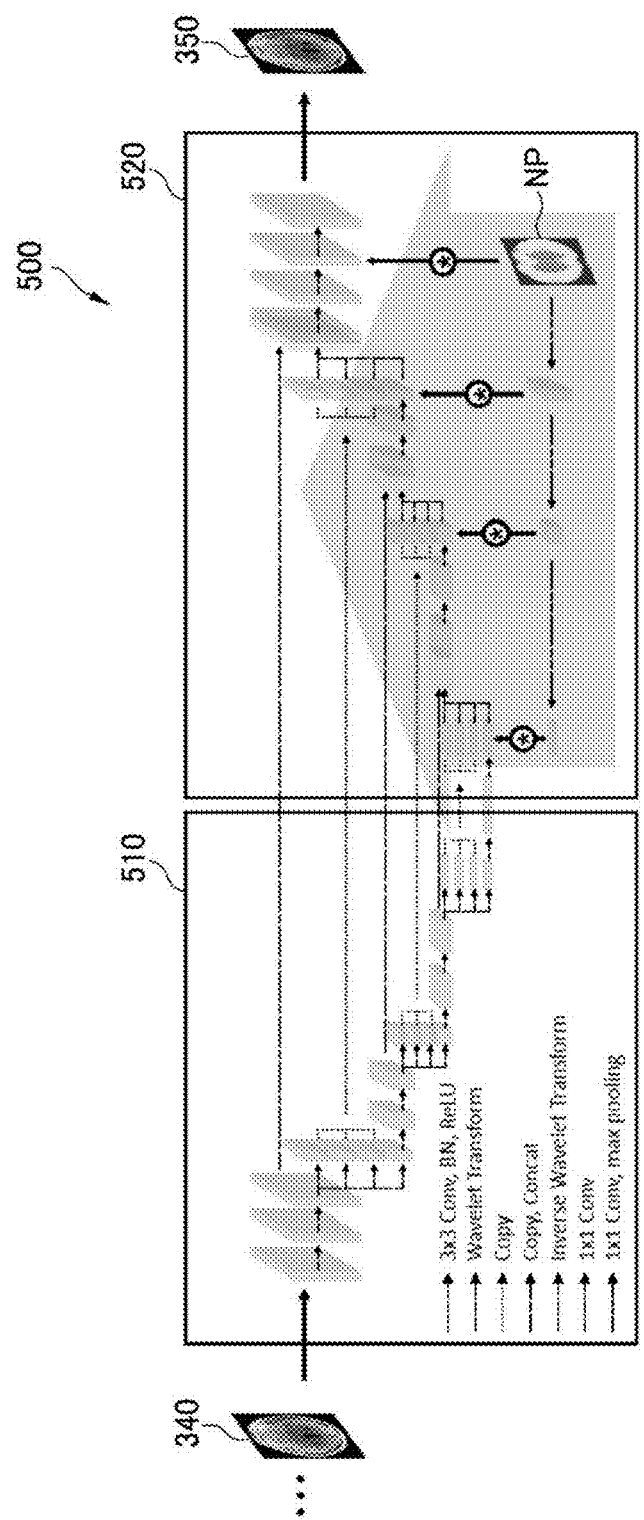
FIG. 10 is a schematic diagram illustrating a structure of the first artificial neural network model according to one embodiment of the present invention.

FIG. 10 is a schematic diagram illustrating a structure of the first artificial neural network model 500 according to one embodiment of the present invention.

Referring to FIG. 10, the first artificial neural network model may have a U-net structure including a contracting path 510 and an expanding path 520.

The contracting path 510 may include a plurality of convolution layers Conv and pooling layers. For example, the contracting path 510 may include a plurality of 3×3 convolution layers as input layers and a plurality of combinations of pooling layers to which a wavelet transform is applied.

The expanding path 520 may include a plurality of convolution layers and un-pooling layers. For example, the expanding path 520 may include a plurality of combinations of a plurality of 3×3 convolution layers and a plurality of combinations of unpooling layers to which an inverse wavelet transform is applied and may further include a 1×1 convolution layer as an output layer. Meanwhile, the noise pattern image NP to be described below is input to each portion of the expanding path 520 to train the first artificial neural network.

FIG. 11 shows diagrams for describing the noise pattern image NP applied to an artificial neural network model as learning data according to one embodiment of the present invention. FIG. 12 shows diagrams for describing an effect of mitigating a hallucination by applying the noise pattern image NP to an artificial neural network model as learning data according to one embodiment of the present invention.

Referring to FIG. 11, the noise pattern image NP may be an image divided and displayed by applying a weight based on a degree of occurrence of noise according to each part of an object in a reconstructed image. As an example, the noise pattern image NP may be a pattern image generated according to noise detected by comparing an image, which is reconstructed by applying a general artificial neural network model to a sub-sampled MR image, with a full-sampled MR image.

Specifically, referring to FIG. 11A, regarding a contrast image 1130 in which a reconstructed image 1120 output by inputting a sub-sampled MR image 1110 to the artificial neural network model is contrasted with a full-sampled MR image, it is possible to confirm a poor-conditioned portion PC in which a large amount of noise occurs in the form of an ellipse erected at a central portion of the image. In addition, it is possible to confirm a good-conditioned portion GC in which a relatively small amount of noise occurs in a direction toward a peripheral portion of the image. The noise pattern image NP is generated based on a difference in noise occurrence between parts of the object.

Figure 11B:
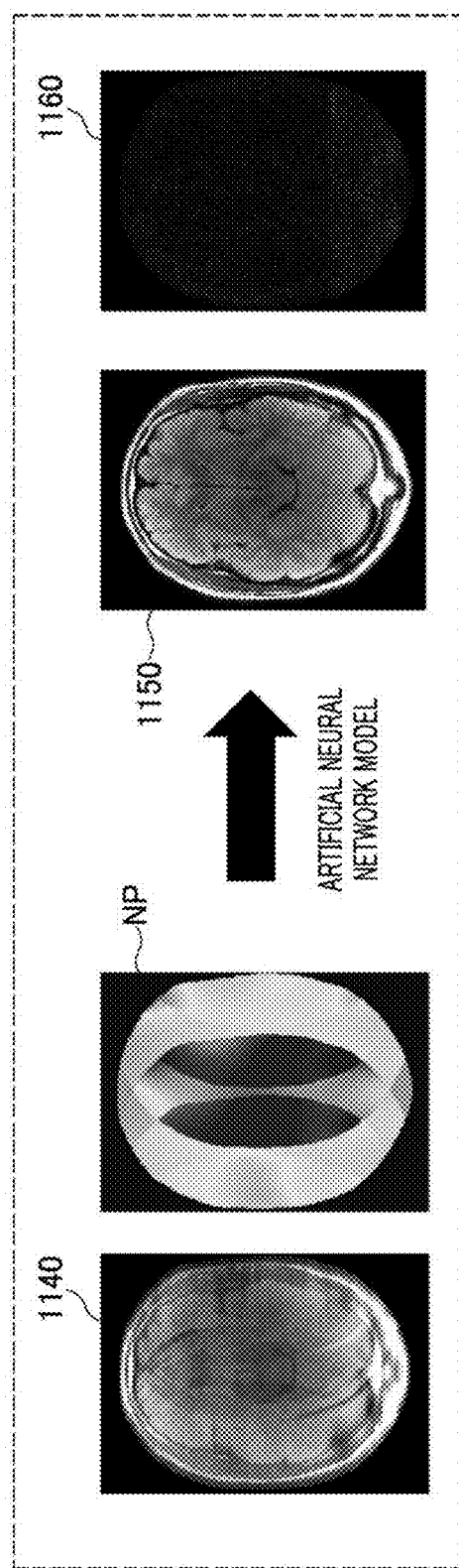
Figure 12:
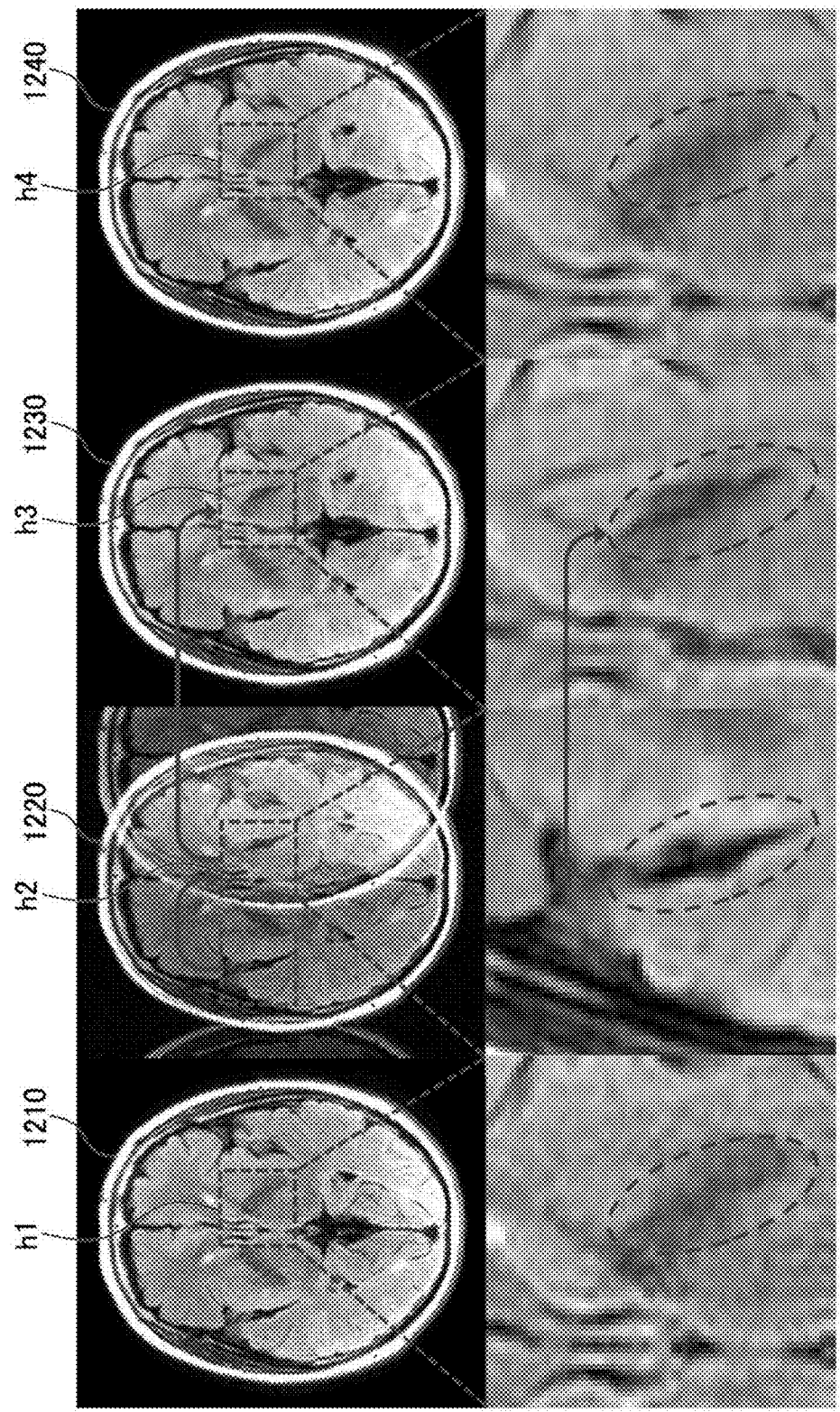
FIG. 12 shows diagrams for describing an effect of mitigating a hallucination by applying a noise pattern image to an artificial neural network model as learning data according to one embodiment of the present invention.

Referring to FIG. 11B, regarding a contrast image 1160 in which a reconstructed image 1150 output by inputting a sub-sampled MR image 1140 and the noise pattern image NP to the artificial neural network model is contrasted with a full-sampled MR image, it can be confirmed that noise is reduced all over the image.

In addition, referring to FIG. 12, it is possible to confirm a full-sampled MR image 1210, a sub-sampled MR image 1220, a reconstructed image 1230 output using an artificial neural network model to which the sub-sampled MR image 1220 is input, and a reconstructed image 1240 output using an artificial neural network model to which the sub-sampled MR image 1220 and the noise pattern image NP are input in order from left to right.

It can be seen that a portion of an image of an object is enlarged below each image. Here, it can be seen that, when an aliased image overlaps a target image, an enlarged portion h2 of the sub-sampled MR image 1220 is different from an enlarged portion h1 of the full-sampled MR image. Such a phenomenon is referred to as a hallucination phenomenon, and it can be confirmed that an image is different even in an enlarged portion h3 of the reconstructed image due to an influence of the sub-sampled MR image. In contrast, in an enlarged portion h4 of the reconstructed image 1240 using the noise pattern image NP, it can be confirmed that a hallucination phenomenon is mitigated similarly to the enlarged portion h1 of the full-sampled MR image 1210.

Referring to an effect of applying the noise pattern image NP, as an exemplary embodiment, the noise pattern image NP generated based on the first MR image may be input to the first artificial neural network model 500. That is, the first artificial neural network model 500 may perform a process of outputting the first output MR image 350 using the first input image data 340 and the noise pattern image NP as input data.

For example, the noise pattern image NP may be input to at least one of the plurality of convolution layers and the unpooling layers of the expanding path 520 of the first artificial neural network model 500. Specifically, the noise pattern image NP may be input to the convolution layer that is an output layer of the expanding path 520 and may be input by being pooled according to an image size of each unpooling layer.

In one embodiment, the MR image processing apparatus 100 may include the self-constructed first artificial neural network model 500. In another embodiment, the MR image processing apparatus 100 may obtain the first artificial neural network model 500 constructed in an external server or an external device from the external server or the external device. The MR image processing apparatus 100 may achieve the purpose of accelerating image acquisition rate and improving image quality by acquiring the first output MR image 350 that is a reconstructed image of a sub-sampled MR based on the first artificial neural network model 500 using the neural network.

Here, the acquired first output MR image 350 may be provided to a user terminal and utilized for diagnosing a lesion area of a patient. Meanwhile, an additional operation of processing an MR image may be performed to increase accuracy of the first output MR image 350.

Figure 13:
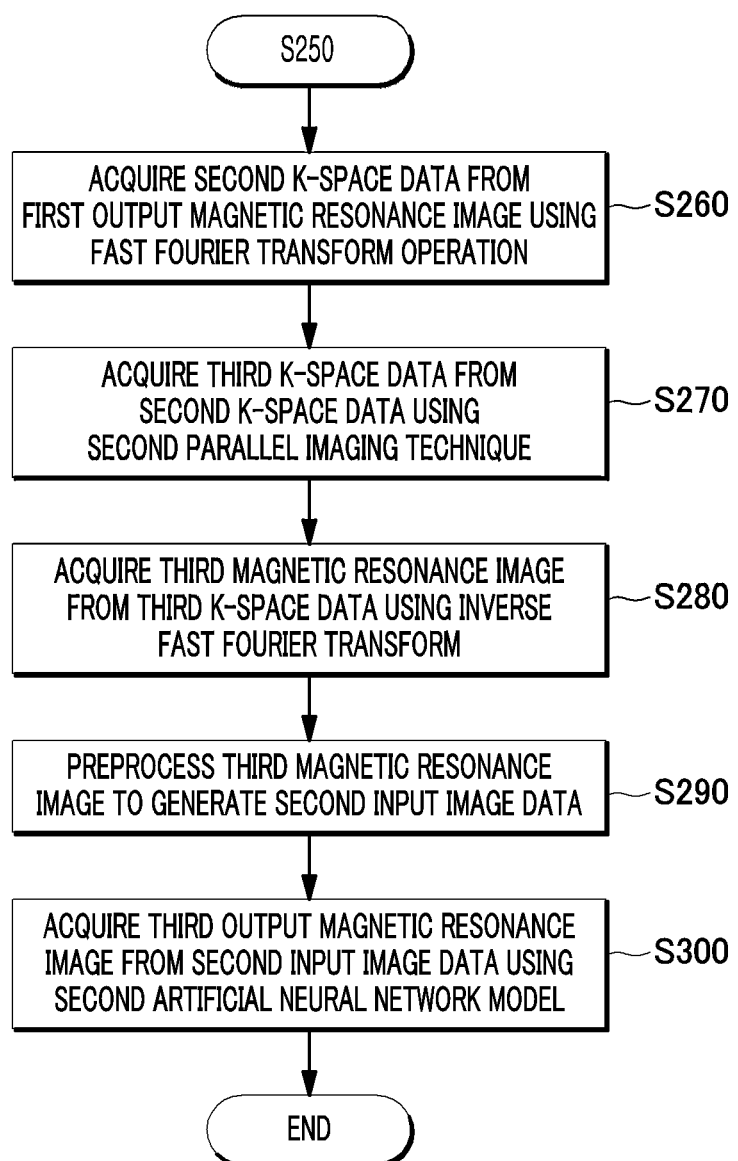
FIG. 13 is a flowchart illustrating a sequence of a magnetic resonance image processing method according to an extended embodiment including the magnetic resonance image processing method according to one embodiment of the present invention.
Figure 14:
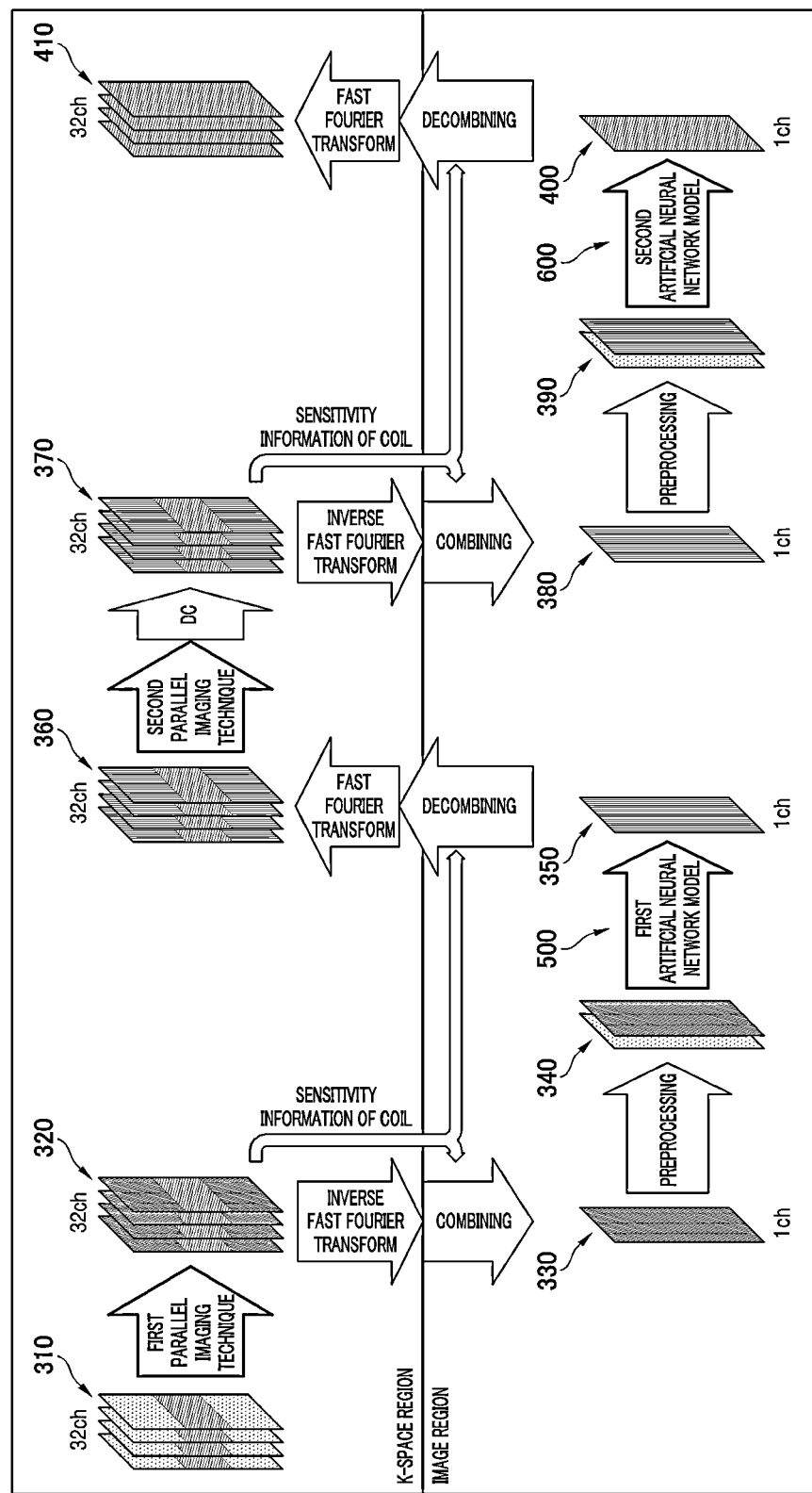
FIG. 14 is a schematic diagram illustrating the magnetic resonance image processing method according to the extended embodiment of the present invention.

FIG. 13 is a flowchart illustrating a sequence of an MR image processing method according to an extended embodiment including the MR image processing method according to one embodiment of the present invention. FIG. 14 is a schematic diagram illustrating the MR image processing method according to the extended embodiment of the present invention.

Referring to FIGS. 13 and 14, after operation S250, operation S260 of acquiring second k-space data 360 from the first output MR image 350 using a fast Fourier transform operation may be performed.

Figure 15:
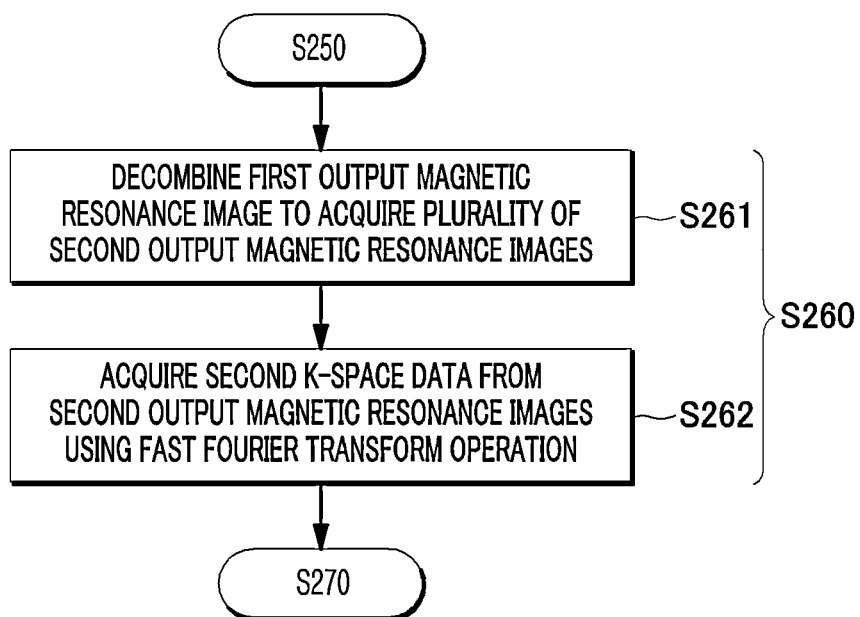
FIG. 15 is a flowchart illustrating an operation of acquiring a second output magnetic resonance image and an operation of acquiring second k-space data according to the extended embodiment of the present invention.

FIG. 15 is a flowchart illustrating an operation of acquiring second output MR images 400 and an operation of acquiring the second k-space data 360 according to the extended embodiment of the present invention.

Referring to FIG. 15, operation S260 of acquiring the second k-space data 360 may include operation S261 of decombining the first output MR image 350 to acquire the plurality of second output MR images 400.

Specifically, the operation of decombining the first output MR image 350 to acquire the plurality of second output MR images 400 may be performed using [Equation 3] or [Equation 4] below.

$$\ddot{c}_i = S_i \cdot \dot{m} \qquad \text{[Equation 3]}$$

$\ddot{C}_i = i^{th}$-second output MR image.
$S_i$=a sensitivity matrix of an $i^{th}$ coil.
$\dot{m}$=a first output MR image according to complex value information.

[Equation 3] is an equation applicable when the first output MR image 350 is acquired according to complex value information.

$$\ddot{c}_i = S_i \cdot (\ddot{m}_{real} \cdot \exp(i \cdot \varphi)) \qquad \text{[Equation 4]}$$

$\ddot{C}_i$=the $i^{th}$-second output magnetic resonance image
$S_i$=the sensitivity matrix of the $i^{th}$ coil.
$\ddot{m}_{real}$=the first output magnetic resonance image according to real value information.
exp (i·φ)=phase information of the first output magnetic resonance image.

[Equation 4] is an equation applicable when the first output MR image 350 is acquired according to real value information. Here, phase information of the first output MR image 350 may be acquired by extracting complex value phase information in the above-described combining process. Accordingly, the first output MR images 350 may be decombined based on sensitivity information of each RF coil to generate a plurality of MR images.

Operation S260 of acquiring the second k-space data 360 may include operation S262 of acquiring the second k-space data 360 from the first output MR images 350 using a fast Fourier transform operation. Accordingly, a plurality of pieces of second k-space data 360 may be acquired by applying a fast Fourier transform to the plurality of MR images generated from the first output MR image 350.

After operation S260, operation S270 of acquiring third k-space data 370 from the second k-space data 360 using a second parallel imaging technique may be performed.

Here, the second parallel imaging technique may be a parallel imaging technique capable of acquiring the corrected full-sampled third k-space data 370 from the full-sampled second k-space data 360. As the second parallel imaging technique, the above-described SPIRIT technique may be used.

Here, since the GRAPPA is used as the first parallel imaging technique and the SPIRIT is used as the second parallel imaging technique, a reconstructed image with higher accuracy is acquired in a process of acquiring a reconstructed image.

After operation S270, operation S280 of acquiring a third MR image from the third k-space data 370 using an IFFT operation may be performed.

After operation S280, operation S290 of preprocessing the third MR image to generate second input image data 390 may be performed.

Here, in a method of preprocessing the third MR image to generate the second input image data 390, the same process may be performed as in the above-described operation S240 of preprocessing the first MR image to generate the first input image data 340.

Meanwhile, in a modified embodiment, operation S290 of preprocessing the third MR image to generate the second input image data 390 may include combining a plurality of third MR images to generate a single fourth MR image 380.

Here, the same method as the above-described method of combining the first MR images to acquire the single second MR image 330 may be used as a method of combining the plurality of third MR images to acquire the single fourth MR image 380.

In addition, operation S290 of preprocessing the third MR image to generate the second input image data 390 may include preprocessing the fourth MR image 380 to generate the second input image data 390.

Here, the same method as the above-described method of preprocessing the second MR image 330 to generate the first input image data 340 may be used as a method of preprocessing the fourth MR image 380 to generate the second input image data 390.

After operation S290, operation S300 of acquiring a third output MR image from the second input image data 390 using a second artificial neural network model 600 may be performed.

Here, the same artificial neural network model as the first artificial neural network model 500 may be used as the second artificial neural network model 600. Alternatively, the first artificial neural network model 500 additionally learning the first input image data 340 may be used, or an artificial neural network model different from the first artificial neural network model 500 may be used.

After operation S300, the second output MR image 400 is Fourier-transformed and/or decombined again and then is Fourier-transformed to acquire a fourth k-space data 410, and based on the second output MR image 400, processes from operation S260 to operation S300 may be repeatedly performed as one set.

In addition, the second output MR image 400 may be provided to a user terminal and used as an image for diagnosing a lesion area of a patient.

Hereinafter, Experimental Examples performed according to the MR image processing apparatus 100 and the MR image processing method according to one embodiment of the present invention will be described.

Figure 16:
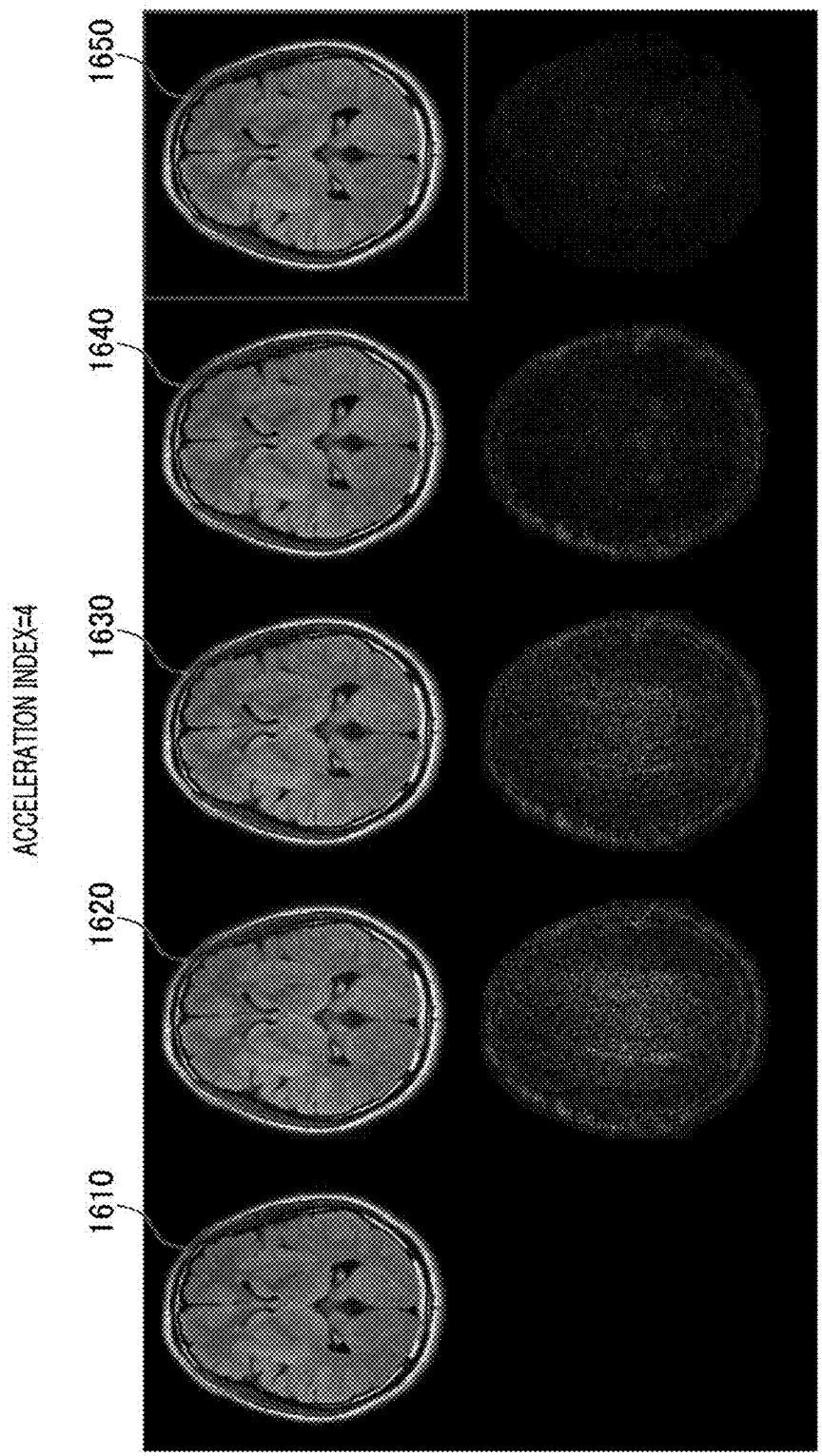
FIG. 16 shows a diagram illustrating a 4-fold accelerated reconstructed image according to an experimental example of the present invention together with comparative examples.

FIG. 16 shows a diagram illustrating a 4-fold accelerated reconstructed image according to an experimental example of the present invention together with comparative examples. Here, an acceleration index may be 4, and the number of sub-sampled lines may be ¼ of the number of full-sampled lines.

Referring to FIG. 16, in order from left to right, it is possible to confirm a full-sampled MR image 1610, an MR image 1620 reconstructed through a GRAPPA technique, an MR image 1630 reconstructed through CG-SENSE, an MR image 1640 reconstructed through a general artificial neural network model, and an MR image 1650 reconstructed by the MR image processing apparatus 100 according to the present invention. It is possible to confirm an image acquired by amplifying an error image by four times below each image, wherein the error image is acquired by imaging a difference from the full-sampled MR image 1610, and it is possible to confirm that the MR image 1650 reconstructed by the MR image processing apparatus 100 according to the present invention has the smallest error.

Figure 17:
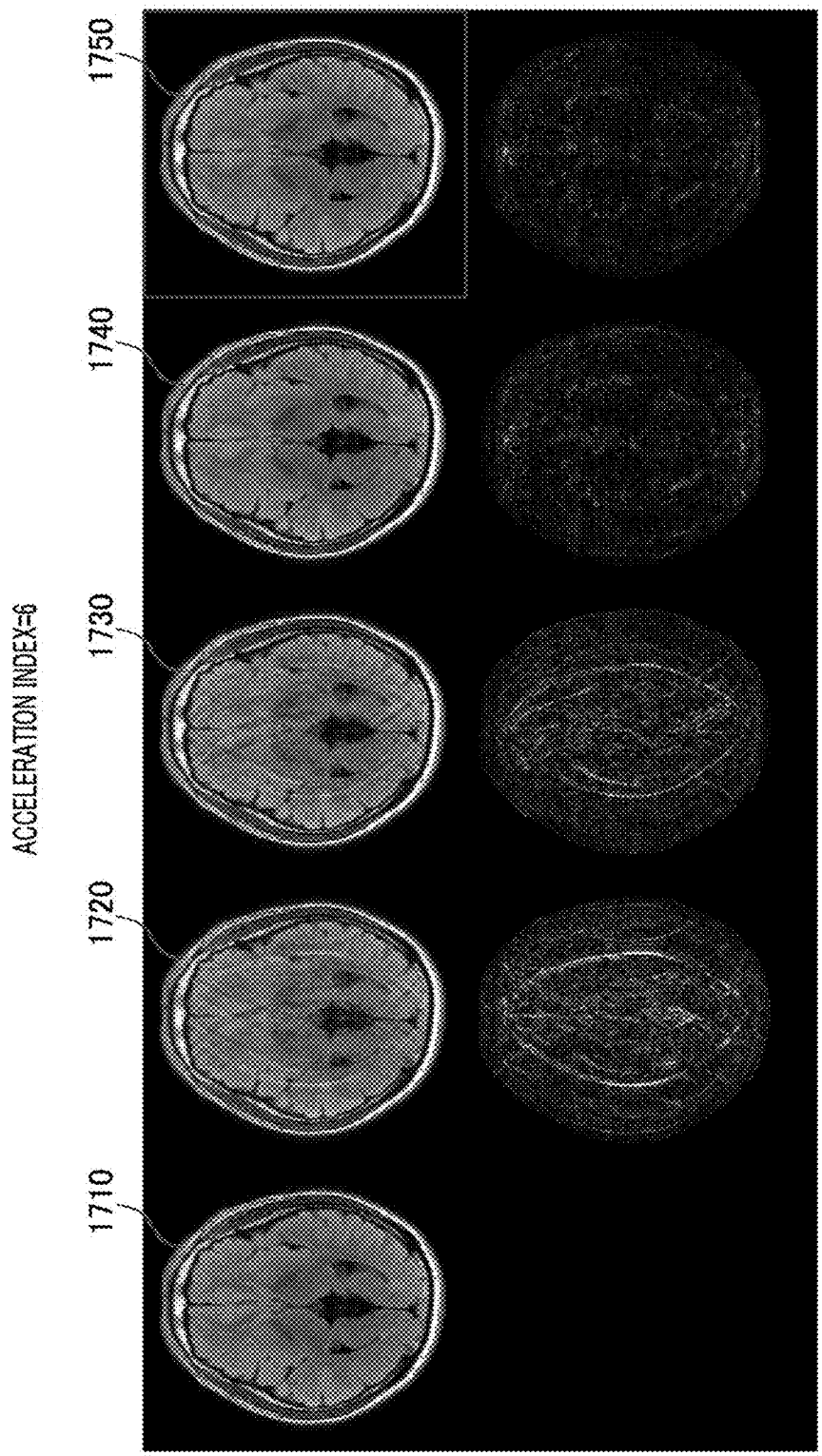
FIG. 17 shows a diagram illustrating a 6-fold accelerated reconstructed image according to another experimental example of the present invention together with comparative examples.

FIG. 17 shows a diagram illustrating a 6-fold accelerated reconstructed image according to another experimental example of the present invention together with comparative examples. Here, an acceleration index may be 6, and the number of sub-sampled lines may be ⅙ of the number of full-sampled lines Referring to FIG. 17, in order from left to right, it is possible to confirm a full-sampled MR image 1710, an MR image 1720 reconstructed through a GRAPPA technique, an MR image 1730 reconstructed through CG-SENSE, an MR image 1740 reconstructed through a general artificial neural network model, and an MR image 1750 reconstructed through the MR image processing apparatus 100 according to the present invention. It is possible to confirm an image acquired by amplifying an error image by four times below each image, wherein the error image is acquired by imaging a difference from the full-sampled MR image 1710, and it is possible to confirm that the MR image 1750 reconstructed by the MR image processing apparatus 100 according to the present invention has the smallest error.

In the MR image processing apparatus 100 and the MR image processing method according to the embodiments of the present invention described above, even when a time taken for an MRI apparatus to capture an MR image is shortened, an MR image with high accuracy can be generated through image reconstruction.

In addition, the MR image processing apparatus 100 and the MR image processing method according to the embodiments of the present invention acquire a plurality of MR images, preprocess the plurality of MR images to generate input data, and provide an output MR image with high accuracy reconstructed using the first artificial neural network model 500 and the second artificial neural network model 600, thereby facilitating a diagnosis of a lesion area of a patient.

Meanwhile, the MR image processing method according to one embodiment of the present invention can be embodied in the form of a storage medium including commands executable by a computer such as a program module executed by the computer. A computer-readable medium may be any usable medium which can be accessed by the computer and includes all volatile/non-volatile and removable/non-removable media. In addition, the computer-readable media may include a computer storage medium. The computer storage medium includes all volatile/non-volatile and removable/non-removable media embodied by a certain method or technology for storing information such as a computer-readable command, a data structure, a program module, or other data. The method and system of the present invention have been described in relation to specific embodiments, but components or some or all of operations thereof can be embodied using a computer system having a general-purpose hardware architecture.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The scope of protection of the present invention should be interpreted by the following claims, and all technical ideas within the scope equivalent thereto should be construed as being included in the scope of the present invention.

What is claimed is:

1. A magnetic resonance image processing method performed by a magnetic resonance image processing apparatus, the magnetic resonance image processing method comprising:
   acquiring a plurality of first magnetic resonance images from a plurality of first k-space data using an inverse fast Fourier transform operation;
   acquiring first input image data by combining the plurality of first magnetic resonance images; and
   acquiring a first output magnetic resonance image from the first input image data using a first artificial neural network model, and
   wherein the acquiring first input image data by combining the plurality of first magnetic resonance images includes,
   acquiring a single second magnetic resonance image by combining the plurality of first magnetic resonance images based on [Equations 1] below, and acquiring the first input image data by preprocessing the second magnetic resonance image, $$c_i = S_i \cdot m, \quad \text{[Equation 1]}$$

$$m_{real} = \left(\sum_i |c_i|^2\right)^{\frac{1}{2}}, \text{ and}$$

$$\left(\sum_i |S_i|^2\right)^{\frac{1}{2}} = 1$$

wherein $C_i$=an $i^{th}$-first magnetic resonance image, $S_i$=a sensitivity matrix of an $i^{th}$ coil, m=the second magnetic resonance image according to complex value information, and $m_{real}$=the second magnetic resonance image according to real value information.

2. The magnetic resonance image processing method of claim 1, wherein acquiring a single second magnetic resonance image by combining the plurality of first magnetic resonance images is performed using [Equation 2] below:

$$M = \sum_i s_i^* \cdot c_i \quad \text{[Equation 2]}$$

wherein m=the second magnetic resonance image according to complex value information, Si*=a conjugate transposed matrix of a sensitivity matrix of an $i^{th}$ coil, and $C_i$=an $i^{th}$-first magnetic resonance image.

3. The magnetic resonance image processing method of claim 1, comprising:
   acquiring a plurality of sub-sampled magnetic resonance signal; and
   acquiring a plurality of first k-space data corresponding to the plurality of sub-sampled magnetic resonance signal based on a first parallel imaging technique.

4. The magnetic resonance image processing method of claim 1, wherein the second magnetic resonance image includes a target image and an image aliased in a phase encoding direction, and
   wherein the acquiring the first input image data by preprocessing the second magnetic resonance image includes:
   shifting the second magnetic resonance image such that the aliased image matches the target image to acquire the shifted second magnetic resonance image; and
   stacking and grouping the second magnetic resonance image and the shifted second magnetic resonance image in a first direction perpendicular to each of the phase encoding direction and a readout direction to acquire the first input image data.

5. The magnetic resonance image processing method of claim 1, wherein a noise pattern image generated based on the plurality of first magnetic resonance images is input to the first artificial neural network model.

6. The magnetic resonance image processing method of claim 5, wherein the first artificial neural network model has an artificial neural network structure including a contracting path and an expanding path,
   wherein the contracting path includes a plurality of convolution layers and pooling layers,
   the expanding path includes a plurality of convolution layers and unpooling layers, and
   the noise pattern image is input to at least one of the plurality of convolution layers and the unpooling layers of the expanding path.

7. The magnetic resonance image processing method of claim 1, comprising acquiring second k-space data from the first output magnetic resonance image using a fast Fourier transform operation,
wherein the acquiring of the second k-space data includes:
decombining the first output magnetic resonance image to acquire a plurality of second output magnetic resonance images; and
acquiring the second k-space data from the second output magnetic resonance images using the fast Fourier transform operation.

8. The magnetic resonance image processing method of claim 7, wherein the decombining of the first output magnetic resonance image to acquire the plurality of second output magnetic resonance images is performed using [Equation 3] or [Equation 4] below:

$$\ddot{c}_i = S_i \cdot \ddot{m} \quad \text{[Equation 3]}$$

wherein $\ddot{c}_i$=an $i^{th}$-second output magnetic resonance image, $S_i$=a sensitivity matrix of an $i^{th}$ coil, and $\ddot{m}$=the first output magnetic resonance image according to complex value information, and $$\ddot{c}_i = S_i \cdot (\ddot{m}_{real} \cdot \exp(i \cdot \varphi)) \quad \text{[Equation 4]}$$

wherein $\ddot{c}_i$=the $i^{th}$-second output magnetic resonance image, $S_i$=the sensitivity matrix of the $i^{th}$ coil, $\ddot{m}$=the first output magnetic resonance image according to real value information, and $\exp(i \cdot \varphi)$=phase information of the first output magnetic resonance image.

9. The magnetic resonance image processing method of claim 7, comprising acquiring third k-space data from the second k-space data.

10. The magnetic resonance image processing method of claim 9, comprising:
acquiring a third magnetic resonance image from the third k-space data using the inverse fast Fourier transform operation;
preprocessing the third magnetic resonance image to generate second input image data; and
acquiring a third output magnetic resonance image from the second input image data using a second artificial neural network model.

11. A magnetic resonance image processing apparatus for performing a magnetic resonance image processing method, the apparatus comprising:
a memory in which a magnetic resonance image processing program is stored; and
a processor configured to:
acquire a plurality of first magnetic resonance images from a plurality of first k-space data obtained by a magnetic resonance imaging apparatus including a plurality of radio frequency (RF) coils, based on an inverse fast Fourier transform operation,
acquire first input image data by combining the plurality of first magnetic resonance images, and
acquire a first output magnetic resonance image from the first input image data using a first artificial neural network model, and
wherein the processor is further configured to acquire a single second magnetic resonance image by combining the plurality of first magnetic resonance images based on [Equations 1] below, and acquire the first input image data by preprocessing the second magnetic resonance image, $$c_i = S_i \cdot m,$$

$$m_{real} = (\Sigma_i |c_i|^2)^{1/2}, \text{ and}$$

$$(\Sigma_i |S_i|^2)^{1/2} = 1 \quad \text{[Equations 1]}$$

wherein $C_i$=an $i^{th}$-first magnetic resonance image, $S_i$=a sensitivity matrix of an $i^{th}$ coil, m=the second magnetic resonance image according to complex value information, and $m_{real}$=the second magnetic resonance image according to real value information.

12. A non-transitory computer-readable recording medium that stores a program configured to execute the magnetic resonance image processing method of claim 1.

* * * * *